US011056871B1

(12) United States Patent
Aceña et al.

(10) Patent No.: US 11,056,871 B1
(45) Date of Patent: Jul. 6, 2021

(54) VEHICLE INTERLEAVED BUSBARS

(71) Applicant: LEAR CORPORATION, Southfield, MI (US)

(72) Inventors: Miguel Angel Aceña, Valls (ES); Josep Maria Roset Rubio, Valls (ES); Ramon Sanchez Rovira, Valls (ES); Youssef Ghabbour, Valls (ES); Enric Aparicio Rollan, Valls (ES); Antonio Martinez Perez, Valls (ES); Antonio Tomas Amenos, Valls (ES)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 16/712,268

(22) Filed: Dec. 12, 2019

(51) Int. Cl.
*H02G 5/02* (2006.01)
*B60R 16/03* (2006.01)
*H05K 1/18* (2006.01)

(52) U.S. Cl.
CPC ............ *H02G 5/025* (2013.01); *B60R 16/03* (2013.01); *H05K 1/181* (2013.01); *H05K 2201/10272* (2013.01)

(58) Field of Classification Search
CPC .................................................... H02G 5/025
USPC ....................................................... 174/88 B
See application file for complete search history.

(56) References Cited

U.S. PATENT DOCUMENTS

| 9,966,584 B2 | 5/2018 | Jan et al. | |
| 2017/0338002 A1* | 11/2017 | Ansari | H01B 5/02 |
| 2017/0345799 A1* | 11/2017 | Rowden | H01L 29/1608 |
| 2018/0286801 A1* | 10/2018 | Lee | H01L 23/60 |
| 2019/0067167 A1* | 2/2019 | Hong | H01L 25/16 |
| 2019/0393800 A1* | 12/2019 | Suzuki | H05K 7/2089 |

OTHER PUBLICATIONS

Cerena De Souza for Larsen & Toubro Limited, "Higher Ampacity of Busbars", Jul.-Sep. 1994, 4 pgs.

* cited by examiner

*Primary Examiner* — Stanley Tso
(74) *Attorney, Agent, or Firm* — Brooks Kushman P.C.

(57) ABSTRACT

In at least one embodiment, a busbar assembly for a vehicle is provided. The assembly includes a printed circuit board (PCB), a first plate, a second plate, and a third plate. The first plate supported on the PCB and is configured to enable a first current to flow in a first direction. The second plate is supported on the PCB and includes a first portion positioned below the first plate to enable a second current to flow in a second direction. The third plate is on the PCB and is positioned below the second plate to enable the first current to flow in the first direction. The second current that flows through the second plate is increased through an effective cross-section of the second plate when the flow of the second current in the second direction is different than the flow of the first current in the first direction.

16 Claims, 5 Drawing Sheets

VEHICLE INTERLEAVED BUSBARS

TECHNICAL FIELD

Aspect disclosed herein may generally related to interleaved busbars in a vehicle. Specifically, aspects disclosed herein may generally relate to interleaved busbars that are used in connection with a direct current (DC) to DC converter in a vehicle or in other vehicle electrification systems that handle high currents at medium to high frequencies. These aspects and others will be discussed in more detail below.

BACKGROUND

U.S. Pat. No. 9,966,584 to Jan et al. discloses a battery pack that includes a busbar at one end, freeing the other end of the battery pack for cooling or other arrangements. A plurality of battery cells has first terminals of the battery cells at first ends of the battery cells. Portions of second terminals of the battery cells are at the first ends of the battery cells. The first ends of the battery cells are in a coplanar arrangement. A plurality of busbars is assembled proximate to the first ends of the battery cells. The busbars are coupled to the first terminals and the second terminals of the battery cells at the first ends of the battery cells to place the battery cells in one of a series connection, a parallel connection or a series and parallel connection.

SUMMARY

In at least one embodiment, a busbar assembly for a vehicle is provided. The assembly includes a printed circuit board (PCB), a first plate, a second plate, and a third plate. The first plate supported on the PCB and is configured to enable current to flow in a first direction. The second plate is supported on the PCB and includes a first portion positioned below the first plate to enable current to flow in a second direction. The third plate is supported on the PCB and is positioned below the second plate to enable current to flow in the first direction. The second current that flows through the second plate is increased through an effective cross-section of the second plate when the flow of the second current in the second direction is different than the flow of the first current in the first direction.

In at least another embodiment, a busbar assembly for a vehicle is also provided. The assembly includes a printed circuit board (PCB), a first plate, a second plate, and a third plate. The first plate supported on the PCB and is configured to enable current to flow in a first direction. The second plate is supported on the PCB and includes a first portion positioned below the first plate to enable current to flow in a second direction. The third plate is supported on the PCB and is positioned below the second plate to enable current to flow in the first direction. The positioning of the first plate, the second plate, and the third plate relative to one another form an interleaved arrangement. The interleaved arrangement reduces a parasitic current in the second plate when the flow of the second current in the second direction is different than the flow of the first current in the first direction.

In at least another embodiment, a busbar assembly for a vehicle is also provided. The assembly includes a first plate, a second plate, and a third plate. The first plate is configured to enable current to flow in a first direction. The second plate includes a first portion positioned below the first plate that is positioned adjacent to the first plate to enable current to flow in a second direction. The third plate is positioned adjacent to the second plate to enable current to flow in the first direction. The interleaved arrangement reduces a parasitic current in the second plate when the flow of the second current in the second direction is different than the flow of the first current in the first direction

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompany drawings in which:

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

It is recognized that directional terms that may be noted herein (e.g., "upper", "lower", "inner", "outer", "top", "bottom", etc.) simply refer to the orientation of various components of a busbar assembly as illustrated in the accompanying figures. Such terms are provided for context and understanding of the embodiments disclosed herein.

A vehicle DC/DC converter may facilitate a transfer of current anywhere between 200-250 Amps. The DC/DC converter may include various switches that are switched in a frequency range of 100-200 KHz. Generally, a transformer is coupled to the DC/DC converter by way of busbars. The busbars may exhibit various conditions that adversely affect performance such as a skin effect and a proximity effect. With the skin effect, current may flow on a limited surface of the busbar in response to cycling switching devices at a mid or high frequency. For example, current may flow on an exterior portion of the overall cross section of the bus and not on an interior portion of the busbar. With the proximity effect, parasitic currents may be present in the busbar assembly which may increase a temperature of the busbars and cause an overheating condition. For example, a plurality of busbars may suffer from severe skin plus proximity effects while current flows that may reach temperatures that may be too high for electronic circuits that are positioned proximate to these busbars. Over-temperature protection (elements or components) are configured to react on a temperature increase and disable the protected device. The monitored temperature may increase because of ambient temperature increase or because excessive power is being dissipated in the monitored device. The protection element may then disconnect the monitored (protected) device (e.g., the protection element may either open the power path or disable the activating control). When busbars exceed a predetermined temperature, the environmental temperature or the area surrounding the busbars increases as well and the protection elements disable the protected devices. In the end, the overall electronic system remains inoperative. In general, such an increase in ambient temperature attributed to an increase in heat generated by the busbars may not be expected. It is desirable to avoid rendering the overall electronic system inoperative due to this aspect.

The embodiments as set forth herein generally provide for a busbar assembly that includes various busbars interleaved with one another. Such an arrangement may maximize the overall cross section of the busbar that current can flow on and may also provide heat dissipation thereby resulting in minimal resistance losses. Additionally, the disclosed busbar assembly may also remove the potential for a temperature increase in the ambient to prevent unexpected electronic system shutdown. These aspects and others will be discussed in more detail herein.

Figure 1:
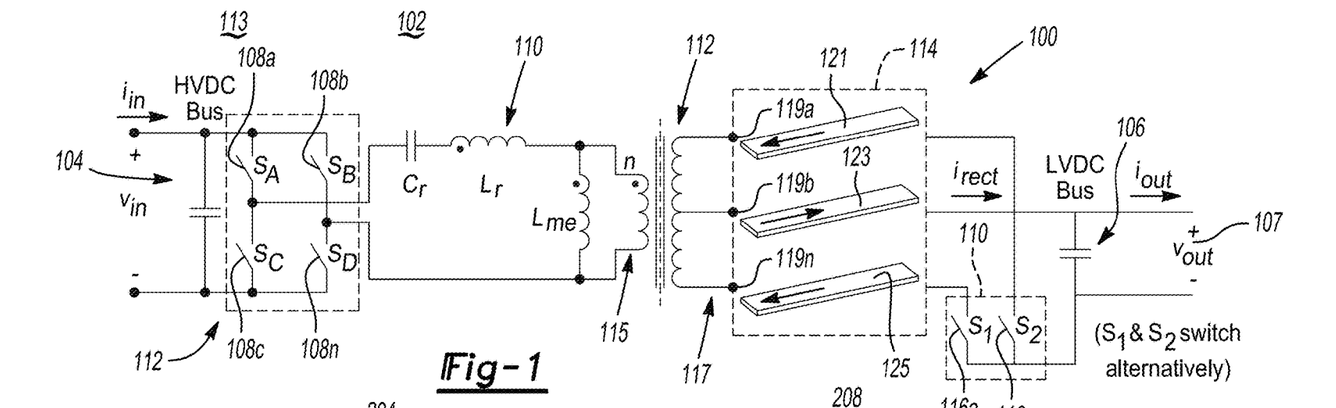
FIG. 1 depicts a system including a busbar assembly for a vehicle in accordance to one embodiment.

FIG. 1 depicts a system 100 including a busbar assembly 114 for a vehicle in accordance to one embodiment. The system 100 generally corresponds to a power converter system (or DC/DC converter) in a vehicle 102 that may convert high voltage (HV) on a HV bus 104 into a low voltage (LV) on a LV bus 106. The system 100 may also store the low voltage LV on one or more vehicle batteries 107 in the vehicle 102.

The system 100 includes a plurality of first switching devices 108a-108n, a resonance circuit 110, a transformer 112, a busbar assembly 114 (or a plurality of busbars 121, 123, 125), and a plurality of second switching devices 116a-116n. In general, a controller 113 controls the plurality of switching device 108a-108n to selectively activate and deactivate at a switching frequency which thereby generates an alternating current (AC). The resonance circuit 110 generally provides a capacitance or inductance to an output provided by the plurality of first switching devices 108a-108n. The transformer 112 may decrease the voltage output of the AC based signal from the resonance circuit 110. In one example, the transformer 112 may be formed of a center tap configuration. In one example, the transformer 112 includes a primary side 115 and a secondary side 117. The secondary side 117 may be formed of two coils that provide contacts (or connections) 119a, 119b, and 119n. The contacts 119a, 119b, and 119n are coupled to the plurality of busbars 121, 123, 125, respectively. The plurality of busbars 121, 123, and 125 receive the decreased AC based signal. The controller 113 controls the plurality of second switching devices 116a-116n to rectify the stepped down AC based signal into a DC signal (e.g., low voltage DC signal) for storage on the battery 107 or to directly supply loads. While the system 100 generally illustrates a single direction flow with respect to the flow of energy from the HV bus 104 to the LV bus 106, it is recognized that the system 100 may also be adapted to enable the flow of energy from the LV bus 106 to the HV bus 104 while utilizing the plurality of busbars 121, 123, and 125 as set forth herein.

Figure 2:
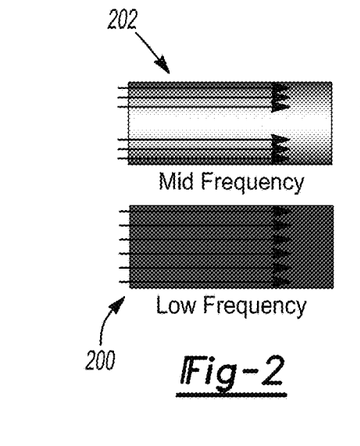
FIG. 2 depicts a skin effect of a busbar assembly.

FIG. 2 depicts a skin effect of a busbar assembly. In general, a busbar assembly (i.e., one or more busbar) may exhibit the skin effect given that the plurality of first switching device 108a-108n are driven by the controller 113 at a switching frequency. As generally shown at 200, at a lower switching frequency, current may pass through the busbar assembly consistently across the entire cross section of the busbar. However, as generally shown at 202, at middle to higher switching frequencies, current may flow through the busbar at top and bottom surfaces of the busbar assembly. Thus, current flows through the busbar assembly on a limited surface area of the busbar which minimizes performance (i.e., cross sectional area of busbar is minimized that enables flow of current through the busbar).

Figure 3:
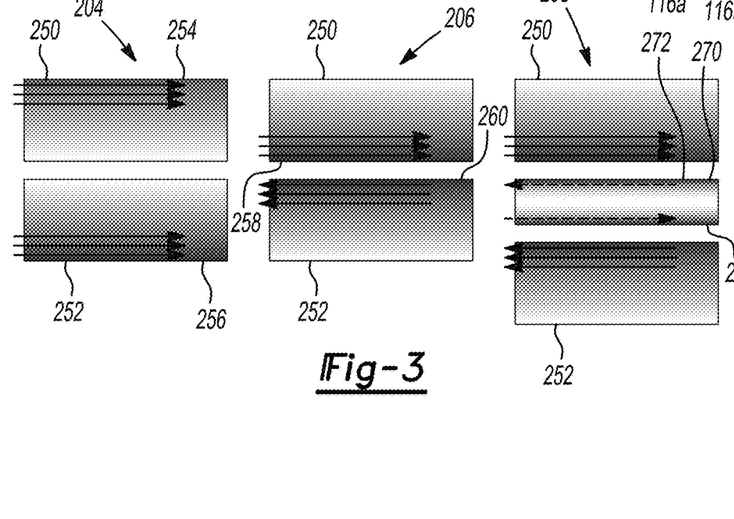
FIG. 3 depicts various examples of a proximity effect for the busbar assembly.

FIG. 3 depicts various examples of a proximity effect for the busbar assembly. As generally shown at 204, a cross sectional view of a first busbar 250 and a second busbar 252 is generally shown. When current flows through the first busbar 250 and the second busbar 252 in the same direction, the current flows on a top side 254 of the first busbar 250 and on a bottom side 256 of the second busbar 252. In the scenario presented in 204, the skin effect concentrates the current on the top side 254 of the first busbar 250 and on the bottom side 256 of the second busbar 252. Thus, current flowing in the first busbar 250 and the second busbar 252 is minimized since the current flows in a smaller cross-sectional area of the first busbar 250 and the second busbar 252.

As generally shown at 206, a cross-sectional view of the first busbar 250 and the second busbar 252 is shown. When current flows through the first busbar 250 and the second busbar 252 in an opposite direction, the current flows through a bottom side 258 of the first busbar 250 and current flows through a top side 260 of the second busbar 252, respectively. Thus, current flowing in the first busbar 250 and the second busbar 252 is minimized since the current flows in a smaller region or smaller cross-sectional area of the first busbar 250 and the second busbar 252.

As generally shown at 208, a cross-sectional view of the first busbar 250, the second busbar 252, and a third busbar 270 is illustrated. The current flows through the first busbar 250 and the second busbar 252 similarly to that illustrated in 206. However, parasitic current is present in the third busbar 270 thus providing a net zero current value. For example, the third busbar 270 exhibits parasitic current that travels on a top side and a bottom side of the third busbar 270 thereof in opposite directions. This aspect may increase the overall temperature of the busbars 250, 252, and 254.

Figure 4:
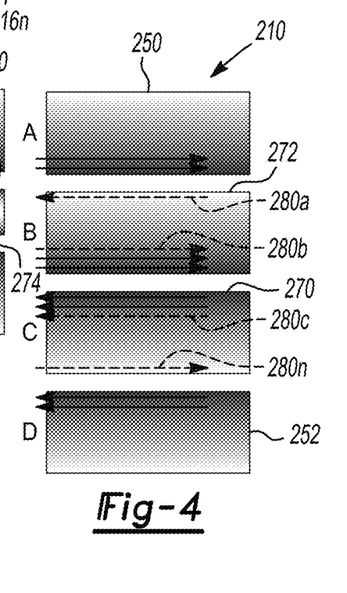
FIG. 4 depicts an example of the proximity effect for the busbar assembly in accordance to one embodiment.

As generally shown at 210 in reference to FIG. 4, a top view of the first busbar 250, the second busbar 252, the third busbar 270, and a fourth busbar 272 is illustrated. The fourth busbar 272 may be added in an attempt to increase current flow. The current flows through the first busbar 250 and the second busbar 252 similarly to that illustrated in 206. This arrangement illustrated at 210 shows that parasitic currents 280a, 280b, 280c, and 280n are present on both the top and bottom sides of the third busbar 270 and the fourth busbar 272 which leads to an additional increase in temperature.

Figure 5:
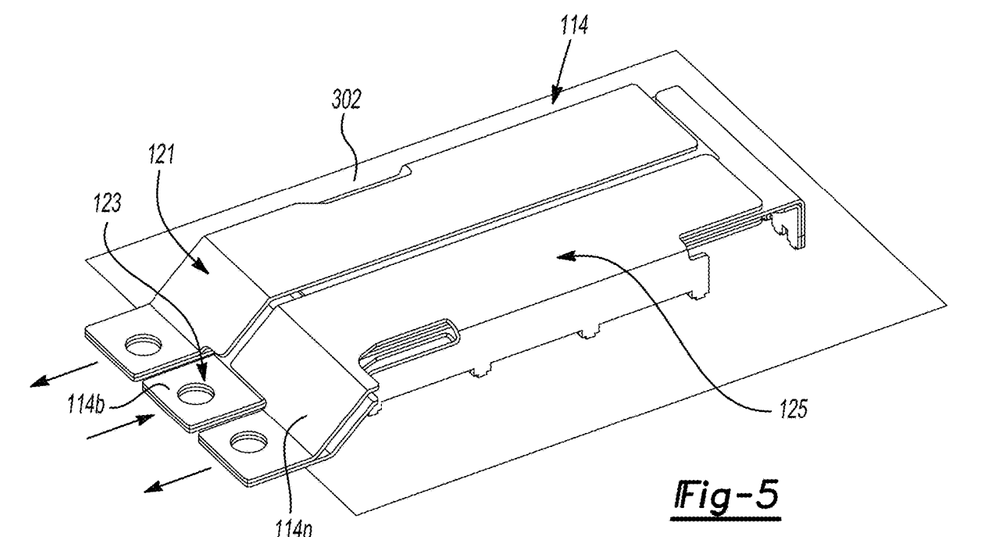
FIG. 5 depicts a perspective view of the busbar assembly in accordance to one embodiment.
Figure 6:
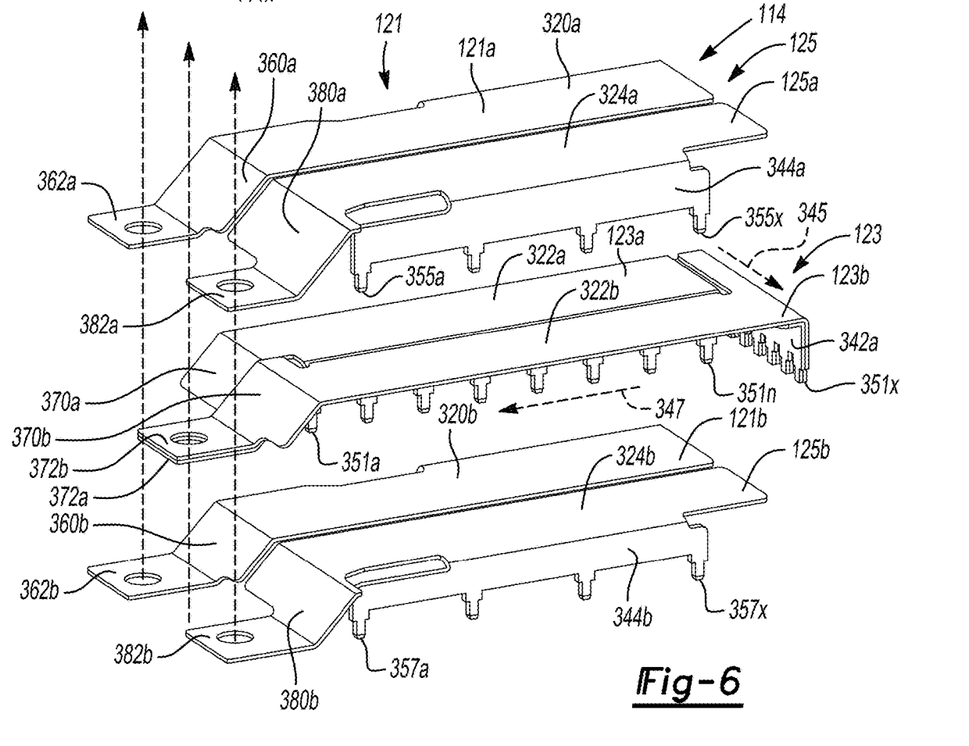
FIG. 6 depicts an exploded view of the busbar assembly in accordance to one embodiment.

FIG. 5 depicts a perspective view of the busbar assembly 114 and FIG. 6 depicts an exploded view of the busbar assembly 114 in accordance to one embodiment. The busbar assembly 114 is generally arranged in an interleaved manner of bus plates 121, 123, and/or 125. For example, busbar 121 may be formed of an upper plate 121a and a lower plate 121b, busbar 123 may be formed of a first center plate 123a and a second center plate 123b, and busbar 125 may be formed of an upper plate 125a and a lower plate 125b. The upper plate 121a and the lower plate 121b of the busbar 121 may be coupled to the connection 119a on the secondary side 117 of the transformer 112. The upper plate 121a and the lower plate 121b generally enable current flow to return back to the secondary side 117 of the transformer 112. The first center plate 123a and the second center plate 123b of the busbar 123 may be coupled to the connection 119b on the secondary side 117 of the transformer 112. The first center plate 123a and the second center plate 123b of the busbar 123 enables current to flow from the secondary side 117 of the transformer 112 to the LV bus 106. The upper plate 125a and the lower plate 125b of the busbar 125 may be coupled to the connection 119n on the secondary side 117 of the transformer 112. The upper plate 125a and the lower plate 125b of the busbar 125 generally enable current flow or return back to the secondary side 117 of the transformer 112. The busbars 121, 123, and 125 are generally connected to a printed circuit board (PCB) 302. The various electronics as noted above in connection with FIG. 1 may also be coupled to the PCB 302. In one example, the PCB 302 may generally lie in a horizontal plane.

Each of the busbars 121, 123, and 125 includes at least one extending section that extends horizontally above the PCB 302. In the example illustrated in FIG. 6 for the busbar 121, the upper plate 121a includes a first extending section 320a and the lower plate 121b includes a second extending section 320b. For the busbar 123, the first center plate 123a includes a first extending section 322a and the second center plate 123b includes a second extending section 322b. For the busbar 125, the upper plate 125a includes a first extending section 324a and the lower plate 125b includes a second extending section 324b. Each of the first extending sections 320a, 322a, 324a and the second extending sections 320b, 322b, and 324b extend over the PCB 302. In one example, each of the first extending sections 320a, 322a, 324a and the second extending sections 320b, 320b, 324b may be axially spaced apart from the PCB 302 (or parallel to a top surface of the PCB 302).

Figure 7:
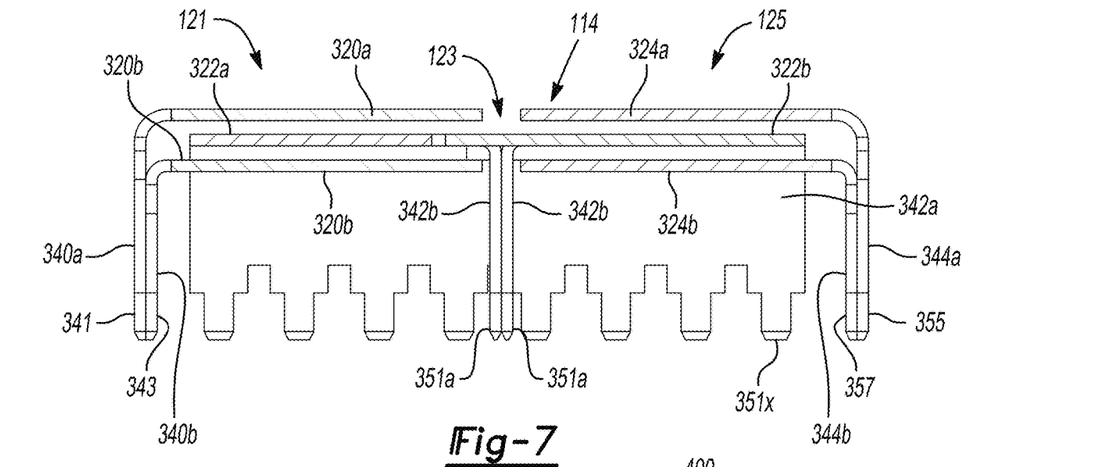
FIG. 7 depicts a cross-sectional view of the busbar assembly in accordance to one embodiment.

For the busbar 121, the upper plate 121a includes a first coupling section 340a (see FIG. 7) having connection portions 341 and the lower plate 121b includes a second coupling section 340b each having connection portions 343 for coupling to the PCB 302 (see also FIGS. 6 and 7). The first coupling section 340a and the second coupling section 340b are generally perpendicular or orthogonal to the first extending section 320a and the second extending section 320b. The connection portions 341 of the upper plate 121a are spaced apart from one another. The connection portions 343 of the lower plate 121b are spaced apart from one another. Additionally, the upper plate 121a includes a ramped portion 360a and a coupling section 362a. The lower plate 123b includes a ramped portion 360b and a coupling section 362b. A fastening mechanism (not shown) may be inserted into an opening formed in the coupling sections 362a, 362b. The coupling sections 362a-362b may extend beyond the PCB 302 to enable fastening mechanisms (not shown) to be couple the busbar 121 to the connection 119a (of a transformer).

Figure 8:
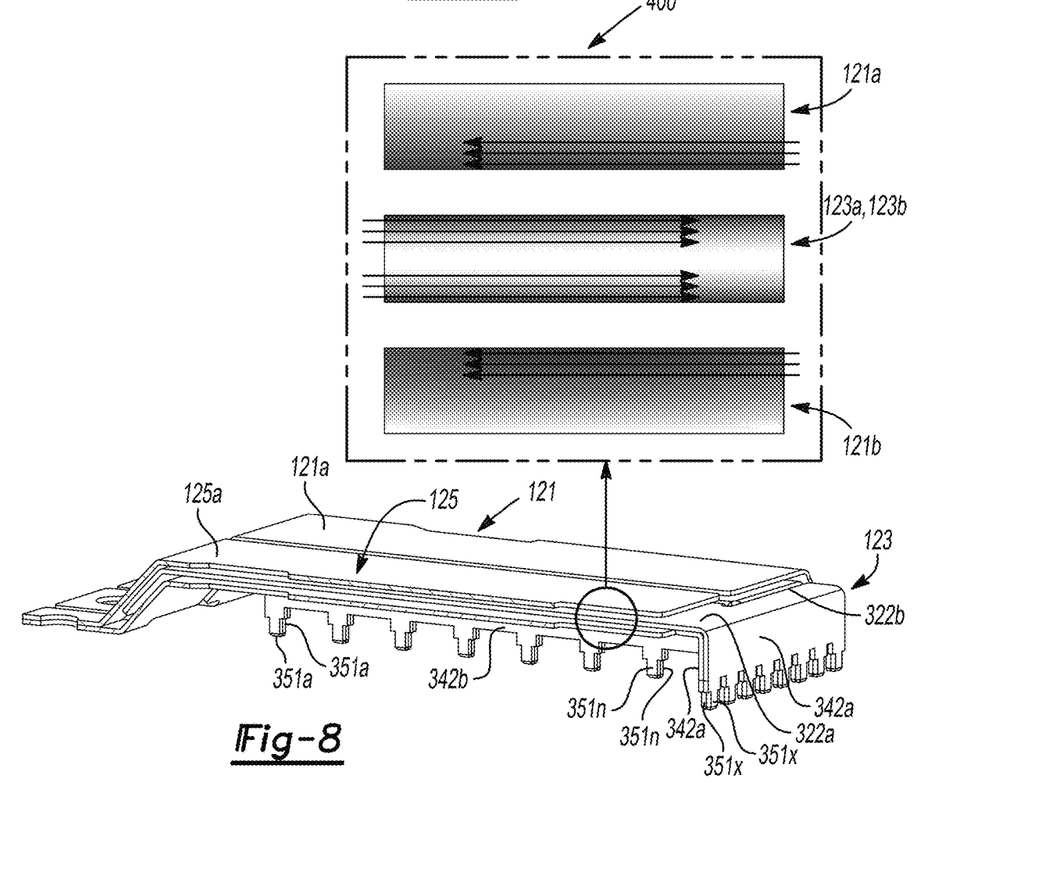
FIG. 8 depicts a perspective view of the busbar assembly in accordance to one embodiment.

The first center plate 123a and the second center plate 123b of the busbar 123 each include a first coupling section 342a and a second coupling section 342b (see FIGS. 6-8). It is recognized that the first center plate 123a and the second center plate 123b are separate from one another but that the first center plate 123a and the second center plate 123b may be coupled to the same holes in the PCB 302 via the first coupling section 342a and the second coupling section 342b for each of the first center plate 123a and the second center plate 123b, respectively. The first coupling section 342a for each of the first center plate 123a and the second center plate 123b may be positioned at a rear of the busbar 123 and extend along a first axis 345. The second coupling section 342b for each of the first center plate 123a and the second center plate 123b may be positioned between the first extending section 322a and the second extending section 322b and may extend along a second axis 347 of the busbar 123. The first axis 345 may generally be perpendicular to the second axis 347. Each of the first coupling sections 342a for the first center plate 123a and the second center plate 123b include connection portions 351a-351x for coupling to the PCB 302. The first coupling section 342a and the second coupling section 342b are generally perpendicular or orthogonal to the first extending section 322a and the second extending section 322b. The connection portions 351a-351x are spaced apart from one another. Additionally, the first center plate 123a includes a first ramped portion 370a and a first coupling section 372a. The second center plate 123b includes a second ramped portion 370b and a second coupling section 372b. The first ramped portion 370a may be positioned behind the second ramped portion 370b and the first coupling section 372a may be positioned below the second coupling section 372b The fastening mechanism (not shown) may be inserted into an opening formed in the first coupling section 372a to couple the busbar 123 to the PCB 302.

The busbar 125 includes a first coupling section 344a and a second coupling section 344b. The first coupling section 344a include connection portions 355a-355x and the second coupling section 344b include connection portions 357a-357x for coupling to the PCB 302. The first coupling section 344a and the second coupling section 344b are generally perpendicular or orthogonal to the first extending section 324a and the second extending section 324b. The connection portions 355a-355x and the connection portions 357a-357x are spaced apart from one another. Additionally, the upper plate 125a includes a ramped portion 380a and a coupling section 382a. The lower plate 125b includes a ramped portion 380b and a coupling section 382b. The fastening mechanism (not shown) may be inserted into an opening formed in the coupling sections 382a, 382b to couple the bottom plate 114n to the PCB 302.

FIG. 7 generally depicts a front-cross sectional view of the busbar assembly 114 in accordance to one embodiment. The view of the busbar assembly 114 does not include the various ramped portions 360a, 360b, 370a, 370b, 380a, 380b and the coupling sections 362a, 362b, 372a, 372b, 382a, 382b for the corresponding busbars 121, 123, and 125 to illustrate the coupling sections 340a, 340b, 342a, 342b, 344a, and 344b. The first coupling section 340a is positioned directly adjacent to the second coupling section 340b of the busbar 121. A corresponding pair of connection portions 341 and 343 for the busbar 121 may be inserted into a single through hole within the PCB 302. The first coupling section 344a are positioned directly adjacent to the second coupling section 344b of the busbar 125.

FIG. 8 depicts a perspective view of the busbar assembly 114 in accordance to one embodiment. View 400 is provided which generally depicts an effective current flow through a cross section of the upper plate 121a and the lower plate 121*b* of the busbar 121 and the first center plate 123*a* of the busbar 123. The first center plate 123*a* of the busbar 123 is generally positioned between the upper plate 121*a* and the lower plate 121*b*. It is recognized that view 400 may also correspond to the upper plate 125*a* and the lower plate 125*b* of the busbar 125 and the second center plate 123*b* of the busbar 123. The second center plate 123*b* of the busbar 123 is generally positioned between the upper plate 125*a* and the lower plate 125*b*. As noted above, the busbars 121 and 125 generally enable current flow to return back to the secondary side 117 of the transformer 112 in the system 100. The busbar 123 enables current to flow from the secondary side 117 of the transformer 112 to the LV bus 106 in the system 100. As shown for the busbar 121, current flows on a bottom section of the upper plate 121*a* thereof that is closer in proximity to the first center plate 123*a*. Likewise, current flows in an opposite direction on a top section of the first center plate 123*a* that is closer in proximity to the upper plate 121*a*. Additionally, current flows in the same direction on a bottom section of the first center plate 123*a* that is closer in proximity to a top section of the lower plate 121*b*. Also, current flows in an opposite direction on the top section of the lower plate 124*b* that is closer in proximity to a bottom section of the first center plate 123*a*. Thus, the effective current that flows across the busbar 123 (the first center plate 123*a* or the second center plate 123*b*) is generally doubled. This arrangement utilizes a greater cross-sectional surface area (or effective cross-sectional surface area) of the busbar 123 to enable current to pass therethrough. This arrangement may also decrease the temperature across the busbar 123 by roughly half since the generation of parasitic currents may be avoided due to the interleaved nature as set forth herein of the busbars 121, 123, and/or 125.

Figure 9:
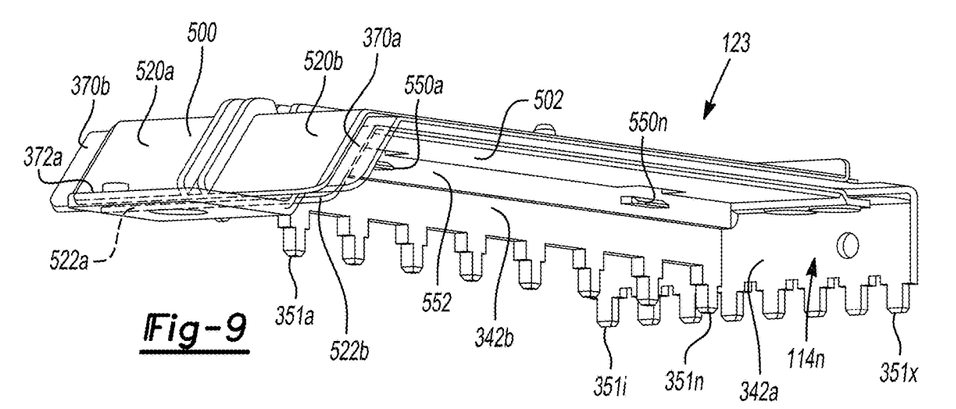
FIG. 9 depicts another perspective view of the busbar assembly in accordance to one embodiment.

FIG. 9 depicts another perspective view of a portion of the busbar assembly 114 in accordance to one embodiment. The busbar assembly 114 as depicted in FIG. 9 does not illustrate the busbars 121 and 125. The busbar assembly 114 includes a first spacer 500 and a second spacer 502. As shown, the first spacer 500 is positioned directly on top of the first center plate 123*a* and the second center plate 123*b* to prevent these plates from coming into physical contact with the upper plate 121*a* of the busbar 121 and the upper plate 125*a* of the busbar 125. The second spacer 502 is positioned directly below the first center plate 123*a* and the second center plate 123*b* to prevent these plates from coming into physical contact with the lower plate 121*b* of the busbar 121 and the lower plate 125*b* of the busbar 125. As shown in view 400 of FIG. 8. Given that the first center plate 123*a* and the second center plate 123*b* enable current to flow in a different direction from the plates 121*a*, 121*b*, 125*a*, 125*b* of the busbars 121 and 125, the first and second center plates 123*a*, 123*b* are physically isolated from the plates 121*a*, 121*b*, 125*a*, 125*b* of the busbars 121 and 125.

The first spacer 500 prevents the first extending section 322*a* and the second extending section 322*b* of the busbar 123 from contacting an underside of the first extending section 320*a* of the busbar 121 and the first extending section 324*a* of the busbar 125. The second spacer 502 prevents the first extending section 322*a* and the second extending section 322*b* of the busbar 123 from contacting a top side of the second extending section 320*b* of the busbar 121 and a top side of the second extending section 324*b* of the busbar 125.

The first spacer 500 includes a first spacer ramped portion 520*a* and a second spacer ramped portion 520*b*. The first spacer ramped portion 520*a* and the second spacer ramped portion 520*b* are positioned underneath the ramped portion 360*a* of the busbar 121 and the ramped portion 380*a* of the busbar 125 to prevent contact between the busbars 121 and 123. The second spacer 502 includes a first spacer ramped portion 522*a* and a second spacer ramped portion 522*b*. The first spacer ramped portion 522*a* and the second spacer ramped portion 522*b* are positioned underneath the ramped portions 370*a*, 370*b* of the busbar 123 to prevent contact between the busbar 123 and 125. The second spacer 502 generally includes a plurality of guiding tabs 550*a*-550*n* that are positioned on a wall 552 thereof to receive and guide the lower plate 125*b* of the busbar 125 to the second spacer 502. The plurality of guiding tabs 550*a*-550*n* may ensure that the busbars 121 and 125 do not separate from the busbar 123. While not shown, the plurality of guiding tabs 550*a*-550*n* may be positioned on the other side of the wall 552 (i.e., facing into the page) to receive and guide the lower plate 121*b* of the busbar 121 to the second spacer 502. While also not shown, the first spacer 500 may also include on the wall 552, a plurality of guiding tabs 550*a*-550*n* to receive and guide the upper plate 121*a* of the busbar 121 and the upper plate 125*a* of the busbar 125 to the first spacer 500.

Figure 10:
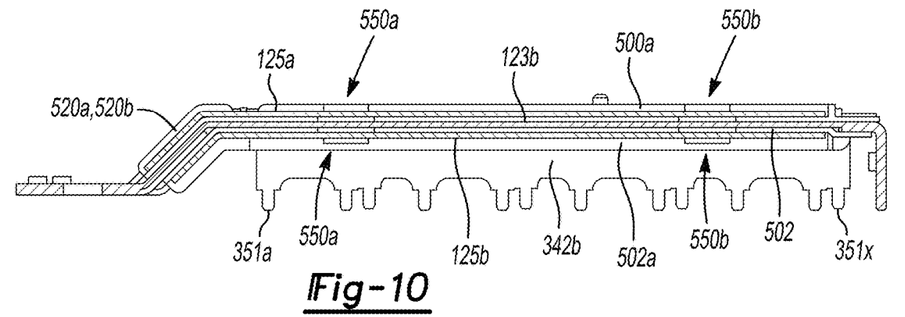
FIG. 10 depicts another perspective view of the busbar assembly in accordance to one embodiment.
Figure 11:
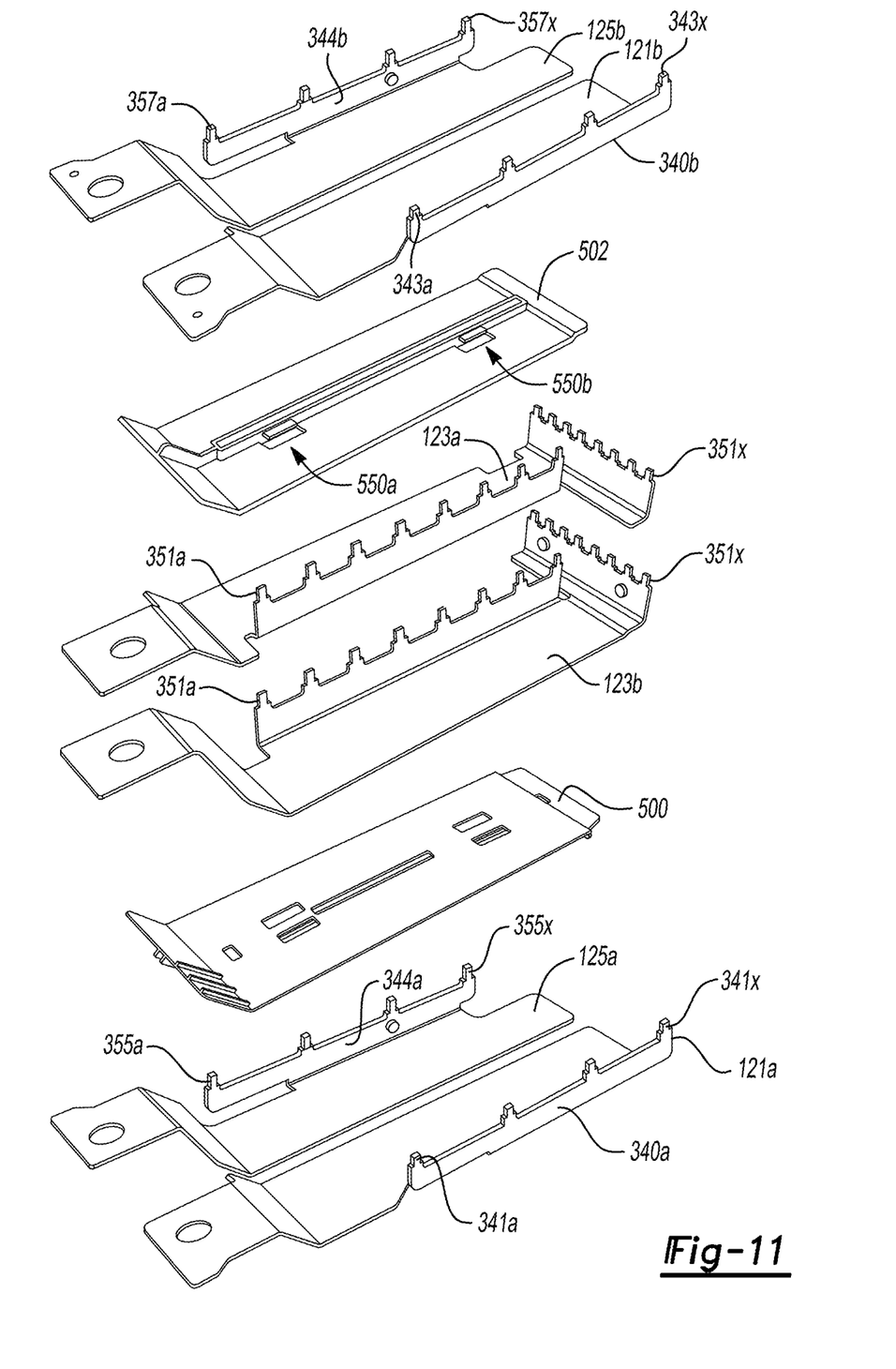
FIG. 11 depicts an exploded underside view of the busbar assembly in accordance to one embodiment.

FIG. 10 depicts a cross-sectional view of the busbar assembly 114 (e.g., only the busbars 123 and 125) including the first spacer 500 and the second spacer 502 in accordance to one embodiment. The first spacer 500 further includes an upper surface 500*a* to isolate the busbar 121 and the busbar 125 laterally. The first spacer 500 includes the guiding tabs 550*a*-550*b* to hold the busbars 121 and 125 in place thereby preventing the busbars 121 and 125 from moving upward. The first spacer 500 and the second spacer 502 includes a corresponding wall (not shown) that includes the plurality of guiding tabs 550*a*-550*n* to receive the busbar 123 to the busbar 125. FIG. 11 depicts an exploded underside view of the busbar assembly 114 in accordance to one embodiment.

Figure 12:
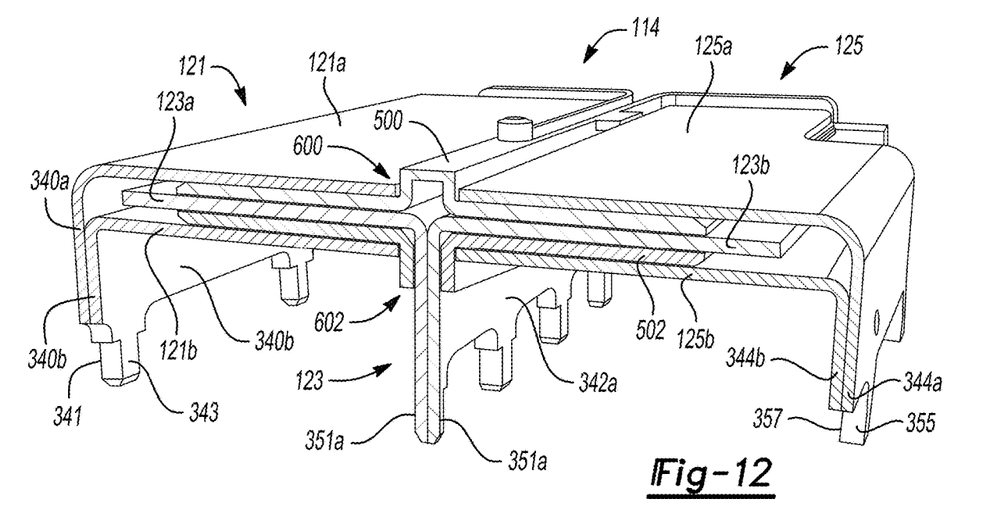
FIG. 12 depicts a cross-sectional view of the busbar assembly along with a first spacer and a second spacer in accordance to one embodiment.

FIG. 12 depicts another cross-sectional view of the busbar assembly 114 along with the first spacer 500 and the second spacer 502 in accordance to one embodiment. The first spacer 500 includes a first dividing section 600 that isolates the upper plate 121*a* of the busbar 121 from the upper plate 125*a* of the busbar 125. As shown, the first dividing section 600 may be U-shaped. It is recognized that the first dividing section 600 may take on any number of shapes to isolate the upper plate 121*a* of the busbar 121 from the upper plate 125*a* of the busbar 125. Similarly, the second spacer 502 may include a second dividing section 602*a* that isolates the lower plate 121*b* of the busbar 121 from the first center plate 123*a* of the busbar 123. The second spacer 502 may also include a third dividing section 602*b* that isolates the lower plate 125*b* from the second center plate 123*b* of the busbar 123.

While the first spacer 500 and the second spacer 502 are generally configured to receive the various busbars 121, 123, 125, portions of the busbars 121, 123, and 125 are fixed to themselves. For example, the first coupling section 340*a* of the upper plate 121*a* and the second coupling section 344*b* of the lower plate 121*b* may be welded or riveted together to fix the upper plate 121*a* and the lower plate 121*b* of the busbar 121 to one another. Additionally, or alternatively, the coupling sections 362*a*, 362*b* of the busbar 121 may be riveted or soldered to one another. Likewise, the first coupling section 342*a* of the first center plate 123*a* and the second center plate 123*b* of the busbar 123 may be welded or riveted together. Additionally, or alternatively, the coupling sections 372*a*, 372*b* of the busbar 123 may be riveted or soldered to one another. The second coupling section 342*b* of the first center plate 123*a* and the second center plate 123b may be welded or riveted together. The first coupling section 344a of the upper plate 125a and the second coupling section 344b of the lower plate 125b may be welded or riveted together to fix the upper plate 125a to the lower plate 125b together. Additionally, or alternatively, the coupling sections 382a, 382b of the busbar 125 may be riveted or soldered to one another. The entire assembly 114 may be soldered to the PCB 302.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A busbar assembly for a vehicle, the assembly comprising:
    a printed circuit board (PCB);
    a first plate supported on the PCB and having a first current that flows in a first direction;
    a second plate supported on the PCB and having a first portion positioned below the first plate, the second plate having a second current that flows in a second direction; and
    a third plate supported on the PCB and being positioned below the first portion of the second plate, the third plate having the first current that flows in the first direction,
    wherein the second current that flows through the second plate is increased through an effective cross-section of the second plate and reduces a parasitic current in the second plate in response to the flow of the second current in the second direction being different than the flow of the first current in the first direction, and
    wherein the first plate includes a first ramped section extending below the first plate,
    and the third plate includes a second ramped section extending below the second plate and being axially aligned with the first ramped section.

2. The busbar assembly of claim 1, wherein positioning of the first plate, the second plate, and the third plate relative to one another form an interleaved arrangement for the busbar assembly, and wherein the interleaved arrangement reduces a temperature across the second plate in response to the flow of the second current in the second direction being different than the flow of the first current in the first direction.

3. The busbar assembly of claim 1 further comprising a fourth plate being separate from the first plate and being supported on the PCB and wherein the fourth plate includes the first current to flow in the first direction.

4. The busbar assembly of claim 3, wherein the second plate includes a second portion that lies in a same plane of the first portion and is positioned below the fourth plate.

5. The busbar assembly of claim 4 further comprising a fifth plate supported on the PCB and being positioned below the second portion of the second plate to provide the first current to flow in the first direction.

6. The busbar assembly of claim 5, wherein the first plate and the fourth plate are positioned on the same plane with one another and wherein the third plate and the fifth plate are positioned on the same plane with one another.

7. A busbar assembly for a vehicle, the assembly comprising:
    a printed circuit board (PCB);
    a first plate supported on the PCB and having a first current that flows in a first direction;
    a second plate supported on the PCB and having a first portion positioned below the first plate, the second plate having a second current that flows in a second direction; and
    a third plate supported on the PCB and being positioned below the first portion of the second plate, the third plate also having the first current that flows in the first direction,
    wherein a positioning of the first plate, the second plate, and the third plate relative to one another form an interleaved arrangement, and
    wherein the interleaved arrangement reduces a temperature across the second plate and reduces a parasitic current in the second plate in response to the flow of the second current in the second direction being different than the flow of the first current in the first direction, and
    wherein the first plate includes a first ramped section extending below the first plate,
    and the third plate includes a second ramped section extending below the second plate and being axially aligned with the first ramped section.

8. The busbar assembly of claim 7, wherein the second current of the second plate is increased through an effective cross-section of the second plate in response to the flow of the second current in the second direction being than the flow of the first current in the first direction.

9. The busbar assembly of claim 7, wherein the first plate includes a first extending section that is spaced apart and parallel to the first portion of the second plate and to the PCB.

10. The busbar assembly of claim 7 further comprising a fourth plate being separate from the first plate and being supported on the PCB, the fourth plate also having the first current that flows in the first direction.

11. The busbar assembly of claim 10, wherein the second plate includes a second portion positioned below the fourth plate.

12. The busbar assembly of claim 11 further comprising a fifth plate supported on the PCB and being positioned below the second portion of the second plate, the fifth plate also having the first current that flows in the first direction.

13. The busbar assembly of claim 12, wherein the first plate and the fourth plate are positioned on a same plane with one another and wherein the third plate and the fifth plate are positioned on the same plane.

14. A busbar assembly for a vehicle, the assembly comprising:
    a first plate including a first current that flows in a first direction;
    a second plate having a first portion and being positioned adjacent to the first plate, the second plate including a second current that flows in a second direction; and
    a third plate being positioned adjacent the first portion of the second plate, the third plate including the first current that flows in the first direction,
    wherein a positioning of the first plate, the second plate, and the third plate relative to one another form an interleaved arrangement,
    wherein the interleaved arrangement reduces a parasitic current in the second plate and a temperature across the second plate in response to the flow of the second current in the second direction being different than the flow of the first current in the first direction, and wherein the first plate includes a first ramped section extending below the first plate, and the third plate includes a second ramped section extending below the second plate and being axially aligned with the first ramped section.

15. The busbar assembly of claim 14, wherein the second current of the second plate is increased through an effective cross-section of the second plate in response to the flow of the second current in the second direction being different than the flow of the first current in the first direction.

16. The busbar assembly of claim 14 further comprising a printed circuit board (PCB) being positioned below the first plate, the second plate, and the third plate for supporting the first plate, the second plate, and the third plate.

\* \* \* \* \*

UNITED STATES PATENT AND TRADEMARK OFFICE
CERTIFICATE OF CORRECTION

Page 1 of 1

PATENT NO. : 11,056,871 B1
APPLICATION NO. : 16/712268
DATED : July 6, 2021
INVENTOR(S) : Acena et al.

It is certified that error appears in the above-identified patent and that said Letters Patent is hereby corrected as shown below:

In the Claims

Column 10, Line 29, Claim 8:
After "second current in the second direction being"
Insert -- *(different)* --

Signed and Sealed this
First Day of March, 2022

Drew Hirshfeld
*Performing the Functions and Duties of the*
*Under Secretary of Commerce for Intellectual Property and*
*Director of the United States Patent and Trademark Office*